(12) United States Patent
Ahn (10) Patent No.: US 9,177,991 B2
(45) Date of Patent: Nov. 3, 2015

(54) PIXEL, METHOD OF MANUFACTURING THE SAME, AND IMAGE PROCESSING DEVICES INCLUDING THE SAME

(71) Applicant: SAMSUNG ELECTRONICS CO., LTD., Suwon-si, Gyeonggi-do (KR)

(72) Inventor: Jung Chak Ahn, Yongin-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/245,226

(22) Filed: Apr. 4, 2014

(65) Prior Publication Data

US 2014/0263965 A1  Sep. 18, 2014

Related U.S. Application Data

(63) Continuation of application No. 13/198,183, filed on Aug. 4, 2011, now Pat. No. 8,729,449.

(30) Foreign Application Priority Data

Sep. 3, 2010 (KR) .................. 10-2010-0086235

(51) Int. Cl.
*H01L 27/00* (2006.01)
*H01L 27/146* (2006.01)

(52) U.S. Cl.
CPC .... *H01L 27/14685* (2013.01); *H01L 27/14609* (2013.01); *H01L 27/14621* (2013.01); *H01L 27/14645* (2013.01)

(58) Field of Classification Search
CPC ............ H01L 27/146; H01L 27/14621; H01L 27/14645; H01L 27/14649; H01L 31/00
USPC ............ 250/208.1, 214.1, 226; 257/294, 432, 257/440; 348/273, 277, 278; 438/70
See application file for complete search history.

(56) References Cited

U.S. PATENT DOCUMENTS

| | | | |
|---|---|---|---|
| 8,729,449 B2 * | 5/2014 | Ahn | 250/208.1 |
| 2006/0001750 A1 * | 1/2006 | Mizuguchi et al. | 348/294 |
| 2006/0145220 A1 | 7/2006 | Hwang | |
| 2007/0272836 A1 | 11/2007 | Higashitsutsumi et al. | |
| 2008/0304156 A1 * | 12/2008 | Koyama | 359/588 |

FOREIGN PATENT DOCUMENTS

| | | |
|---|---|---|
| JP | 2005-006066 | 1/2005 |
| JP | 2006-237737 | 9/2006 |
| JP | 2008-092247 | 4/2008 |
| KR | 1020090117437 | 11/2009 |

* cited by examiner

*Primary Examiner* — Kevin Pyo
(74) *Attorney, Agent, or Firm* — F. Chau & Associates, LLC (57) ABSTRACT

A pixel of an image sensor includes a color filter configured to pass visible wavelengths, and an infrared cut-off filter disposed on the color filter configured to cut off infrared wavelengths.

14 Claims, 9 Drawing Sheets

PIXEL, METHOD OF MANUFACTURING THE SAME, AND IMAGE PROCESSING DEVICES INCLUDING THE SAME

CROSS-REFERENCE TO RELATED APPLICATIONS

This application is a continuation application of U.S. application Ser. No. 13/198,183, filed on Aug. 4, 2011, which claims priority under 35 U.S.C. §119 to Korean Patent Application No. 10-2010-0086235, filed on Sep. 3, 2010, the contents of which are herein incorporated by reference in their entireties.

BACKGROUND

1. Technical Field

The present invention relates to an image sensor, and more particularly, to a pixel in an image sensor, a method of manufacturing the pixel, and image processing devices including the same.

2. Discussion of the Related Art

Image sensors use long wavelengths to simultaneously detect color image information and depth information of an object. For example, depth sensors detect depth information of an object using an infrared filter.

A color filter disposed on pixels in a depth sensor passes infrared wavelengths as well as visible wavelengths. As a result of the passing of infrared wavelengths by the color filter, color crosstalk may occur.

SUMMARY

According to exemplary embodiments of the present inventive concept, a pixel includes an infrared cut-off filter disposed on a color filter which blocks infrared wavelengths, thereby preventing or reducing color crosstalk that may be caused by the color filter. Exemplary embodiments further include a method of manufacturing the pixel, and image processing devices including the same.

According to exemplary embodiments of the present inventive concept, a pixel of an image sensor includes a color filter configured to pass visible wavelengths, and an infrared cut-off filter disposed on the color filter configured to cut off infrared wavelengths.

The color filter may be a red filter, a blue filter, or a green filter. Alternatively, the color filter may be a cyan filter, a yellow filter, or a magenta filter.

According to exemplary embodiments of the present inventive concept, a pixel array of an image sensor includes a first pixel of a first pixel type and a second pixel of a second pixel type. The first pixel includes a color filter configured to pass visible wavelengths, and an infrared cut-off filter disposed on the color filter configured to cut off infrared wavelengths. The second pixel includes an infrared filter configured to pass the infrared wavelengths.

The color filter may be a red filter, a blue filter, or a green filter. Alternatively, the color filter may be a cyan filter, a yellow filter, or a magenta filter.

According to an exemplary embodiment of the present inventive concept, an image processing device includes the above-described image sensor and a processor configured to control an operation of the image sensor.

According to an exemplary embodiment of the present inventive concept, a method of manufacturing a pixel array of an image sensor includes forming a plurality of unit pixel circuits for each of a plurality of pixels on a substrate, forming a dielectric layer on the unit pixel circuits, forming a color filter and an infrared filter on the dielectric layer, forming an infrared cut-off filter on the color filter and the infrared filter, etching the infrared cut-off filter formed on the infrared filter, and forming a microlens on the infrared cut-off filter and the infrared filter. The color filter is formed on pixels of a first pixel type and the infrared filter is formed on pixels of a second pixel type. The color filter is configured to pass visible wavelengths. The infrared filter is configured to pass infrared wavelengths. The infrared cut-off filter is configured to cut off infrared wavelengths.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Exemplary embodiments of the present inventive concept will be described more fully hereinafter with reference to the accompanying drawings. Like reference numerals may refer to like elements throughout the accompanying drawings.

It will be understood that although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Figure 1:
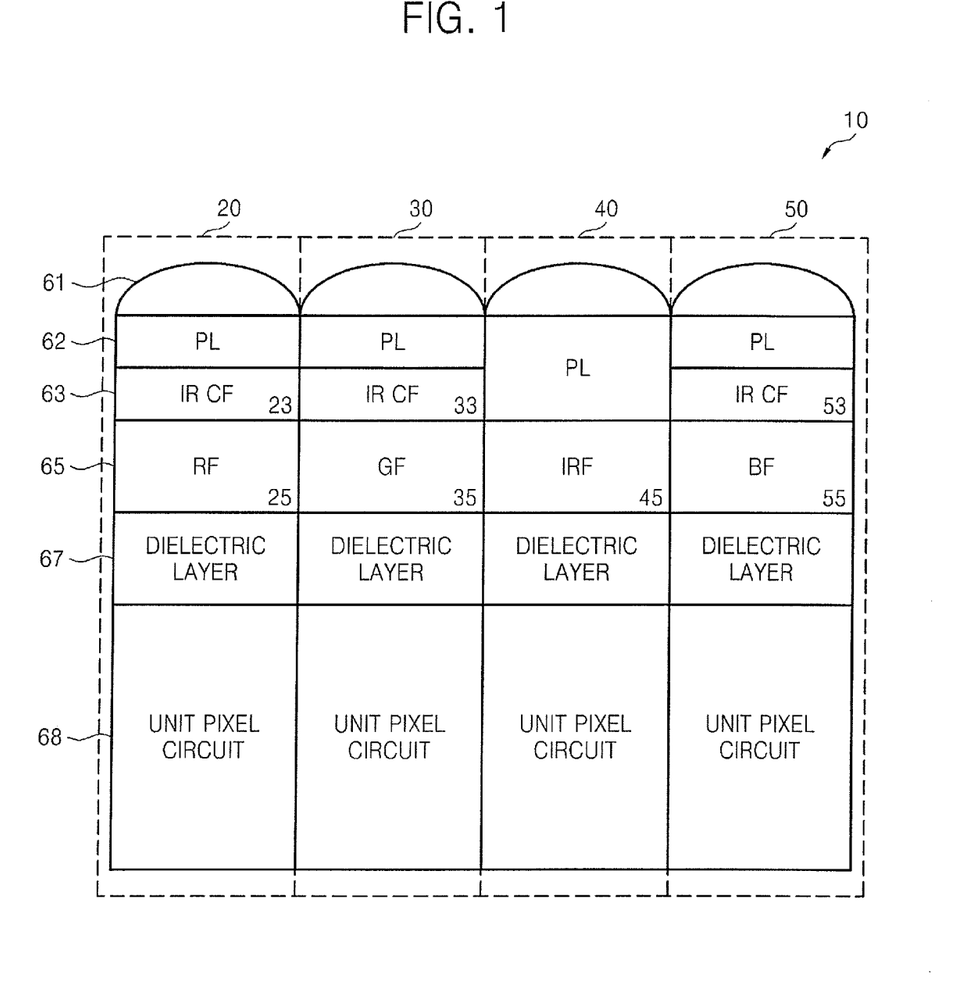
FIG. 1 is a cross-sectional view of a pixel array according to an exemplary embodiment of the present inventive concept.

FIG. 1 is a cross-sectional view of a pixel array 10 according to an exemplary embodiment of the present inventive concept. The pixel array 10 includes pixels of a first pixel type and a second pixel type. In the pixel array 10, a first pixel 20, a second pixel 30, and a third pixel 50 are pixels of the first pixel type, and a fourth pixel 40 is of the second pixel type.

The pixel array 10 further includes a unit pixel circuit area 68 disposed in each pixel, a dielectric layer 67 formed in each pixel, a color filter 65 formed in the first through third pixels 20, 30, and 50, an infrared filter 45 formed in the fourth pixel 40, an infrared cut-off filter 63 formed in the first through third pixels 20, 30, and 50, a planarization layer 62 formed in each pixel, and a microlens 61 disposed on each pixel. The color filter 65 includes a red filter 25 formed in the first pixel 20, a green filter 35 formed in the second pixel 30, and a blue filter 55 formed in the third pixel 50. The infrared cut-off filter 63 includes an infrared cut-off filter 23 formed in the first pixel 20, an infrared cut-off filter 33 formed in the second pixel 30, and an infrared cut-off filter 53 formed in the third pixel 50. Pixels of the first pixel type, including the first pixel 20, the second pixel 30, and the third pixel 50, have a substantially similar structure. Thus, the first pixel type is described herein with reference to the first pixel 20.

The first pixel 20 includes a microlens 61, an infrared cut-off filter 23, a color filter 65, a dielectric layer 67, and a unit pixel circuit area 68. In an exemplary embodiment, the first pixel 20 does not include the microlens 61. The microlens 61 collects incident light.

The infrared cut-off filter 23 is disposed on the color filter 65 and cuts off wavelengths in the infrared region (hereinafter referred to as "infrared wavelengths"). Accordingly, the first pixel 20 cuts off the infrared wavelengths, which may prevent or reduce color crosstalk that may be caused by the color filter 65. The color filter 65 passes (e.g., transmits) wavelengths in the visible region (hereinafter referred to as "visible wavelengths").

In an exemplary embodiment, the color filter 65 of the first pixel 20 is a red filter 25. The red filter 25 passes red wavelengths among the visible wavelengths passed by the infrared cut-off filter 23 of the first pixel 20. The color filter 65 of the second pixel 30 is a green filter 35. The green filter 35 passes green wavelengths among the visible wavelengths passed by the infrared cut-off filter 33 of the second pixel 30. The color filter 65 of the third pixel 50 is a blue filter 55. The blue filter 55 passes blue wavelengths among the visible wavelengths passed by the infrared cut-off filter 53 of the third pixel 50.

The dielectric layer 67 is disposed between the color filter 65 and the unit pixel circuit area 68. The dielectric layer 67 may be formed of, for example, an oxide layer or a composite layer of an oxide layer and a nitride layer, however the dielectric layer 67 is not limited thereto. The unit pixel circuit area 68 is an area in which a unit pixel circuit is disposed.

Figure 2:
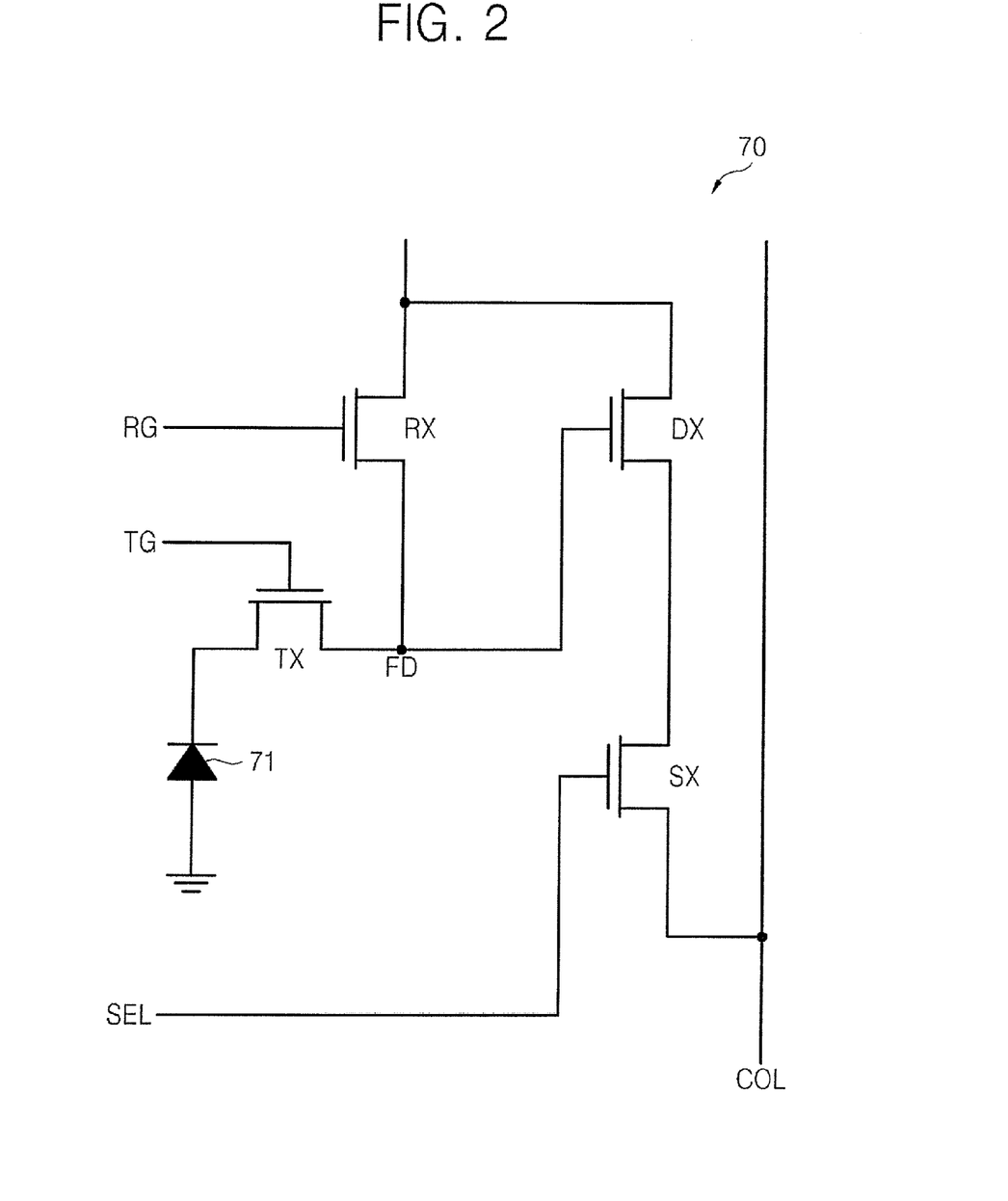
FIG. 2 is a circuit diagram of a unit pixel circuit illustrated in FIG. 1 according to an exemplary embodiment of the present inventive concept.

FIG. 2 is a circuit diagram of a unit pixel circuit 70 disposed in the unit pixel circuit area 68 illustrated in FIG. 1. Referring to FIGS. 1 and 2, the unit pixel circuit 70 includes a photoelectric conversion element 71, a reset transistor RX, a transfer transistor TX, a drive transistor DX, and a selection transistor SX.

The photoelectric conversion element 71 generates photons in response to incident light. The photoelectric conversion element 71 may be, for example, a photodetector including a photo diode, a photo transistor, a photo gate, or a pinned photo diode (PPD), however the photoelectric conversion element 71 is not limited thereto.

The reset transistor RX resets a floating diffusion region FD in response to a reset signal RG. The transfer transistor TX transmits photocharges generated by the photoelectric conversion element 71 to the floating diffusion region FD in response to a transfer signal TG. The drive transistor DX functions as a source follower buffer amplifier. For example, the drive transistor DX performs buffering in response to the photocharges in the floating diffusion region FD. The selection transistor SX selects a unit pixel which will output a pixel signal output from the drive transistor DX in response to a selection signal SEL, and outputs the pixel signal to a column line COL.

In the exemplary embodiment illustrated in FIG. 2, the unit pixel circuit 70 includes a single photoelectric conversion element 71 and four transistors TX, RX, DX, and SX, however the present inventive concept is not limited thereto.

Referring to FIG. 1, according to an exemplary embodiment, the pixel array 10 may also include a planarization layer 62. The planarization layer 62 allows the microlens 61 to be formed on a substantially smooth and even surface. The planarization layer 62 may be made using, for example, an acrylic or epoxy material, however the planarization layer 62 is not limited thereto. The planarization layer 62 may not be utilized when the surface of the infrared cut-off filter 23 is even or has been polished. The thickness of the planarization layer 62 on the fourth pixel 40 may be greater than the thickness of the planarization layer on the first through third pixels 20, 30, and 50 since the fourth pixel 40 does not include an infrared cut-off filter and the planarization layer is formed on the infrared filter 45. The second pixel 30 and the third pixel 50 have a substantially similar structure as the first pixel 20, except for having different color filters (e.g., the second pixel 30 includes a green filter 35 and the third pixel 50 includes a blue filter 55).

The fourth pixel 40 of a second pixel type includes a microlens 61, an infrared filter 45, a dielectric layer 67, and a unit pixel circuit area 68. The infrared filter 45 passes only infrared wavelengths among the wavelengths of light passing through the microlens 61. The second pixel type is described herein with reference to the fourth pixel 40.

In the fourth pixel 40, the dielectric layer 67 is disposed between the infrared filter 45 and the unit pixel circuit area 68. The dielectric layer 67 may be formed of, for example, an oxide layer or a composite layer of an oxide layer and a nitride layer, however the dielectric layer 67 is not limited thereto. The unit pixel circuit area 68 is an area in which a unit pixel circuit is disposed. The function and operation of the unit pixel circuit area 68 of the fourth pixel 40 are the same as the function and operation of the unit pixel circuit area 68 of the first pixel 20. Thus, descriptions thereof are omitted.

Figure 3:
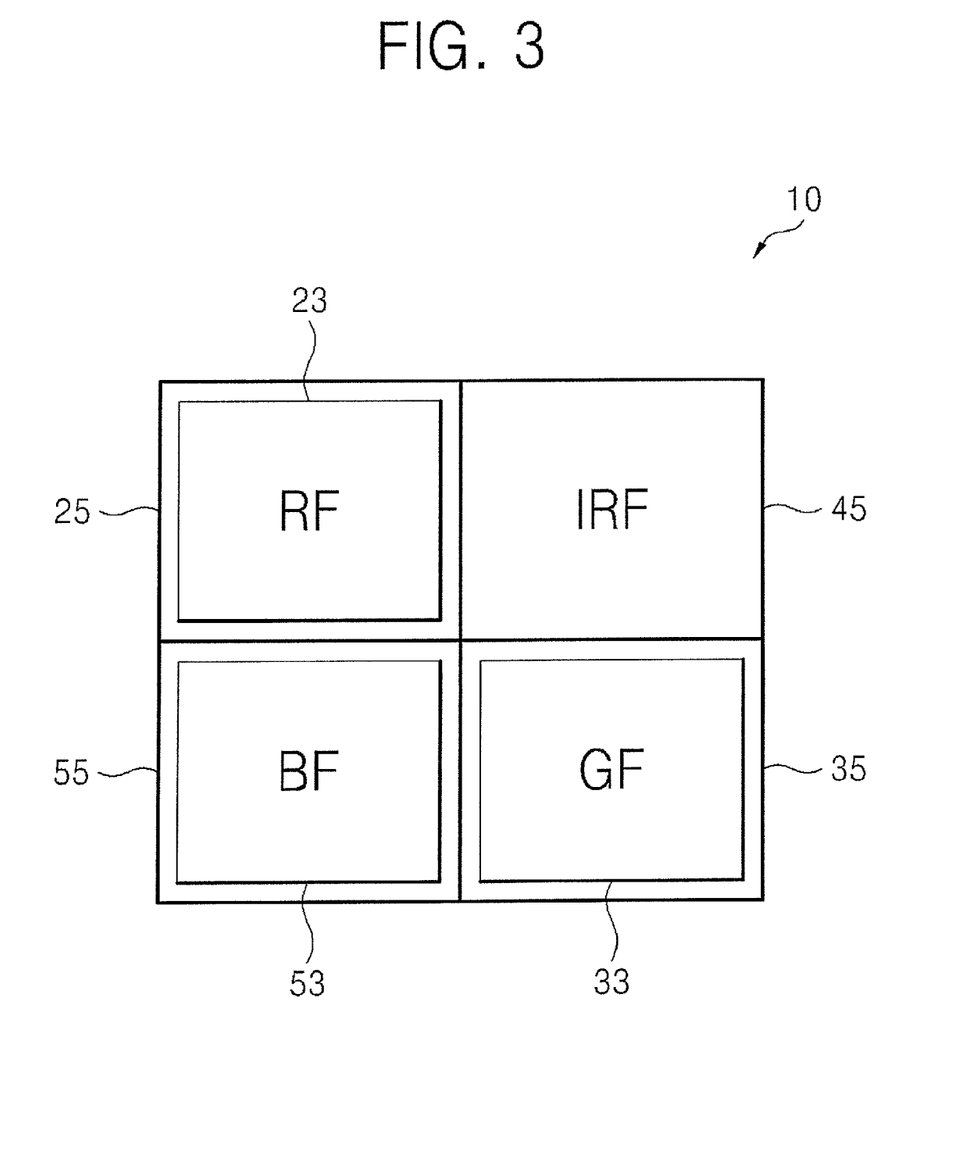
FIG. 3 is a plan view of the pixel array illustrated in FIG. 1 according to an exemplary embodiment of the present inventive concept.

FIG. 3 is a plan view of the pixel array 10 illustrated in FIG. 1. Referring to FIGS. 1-3, the pixel array 10 includes pixels of a first pixel type and a second pixel type.

In an exemplary embodiment, the first pixel 20, the second pixel 30, and the third pixel 50 are of the first pixel type. The first pixel 20 includes the infrared cut-off filter 23 and the red filter 25. The infrared cut-off filter 23 cuts off the infrared wavelengths and passes the visible wavelengths, and the red filter 25 passes the red wavelengths among the visible wavelengths passed by the infrared cut-off filter 23. The second pixel 30 includes the infrared cut-off filter 33 and the green filter 35. The infrared cut-off filter 33 cuts off the infrared wavelengths and passes the visible wavelengths, and the green filter 35 passes the green wavelengths among the visible wavelengths passed by the infrared cut-off filter 33. The third pixel 50 includes the infrared cut-off filter 53 and the blue filter 55. The infrared cut-off filter 53 cuts off the infrared wavelengths and passes the visible wavelengths, and the blue filter 55 passes the blue wavelengths among the visible wavelengths passed by the infrared cut-off filter 53.

Pixels of the first pixel type include infrared cut-off filters and color filters. For example, the first through third pixels 20, 30, and 50 include the infrared cut-off filters 23, 33, and 53, and the color filters 25, 35, and 55, respectively. The infrared cut-off filters 23, 33 and 53 may prevent or reduce color crosstalk that may be caused by the color filters 25, 35, and 55.

Pixels of the second pixel type include an infrared filter. For example, the fourth pixel 40 includes the infrared filter 45. The infrared filter 45 passes only the infrared wavelengths. As will be appreciated by one having ordinary skill in the art, the layout pattern of pixels of the first pixel type (e.g., the first through third pixels 20, 30, and 50) and pixels of the second pixel type (e.g., the fourth pixel 40) is not limited to the exemplary embodiments illustrated in FIGS. 1 and 3.

Figure 4:
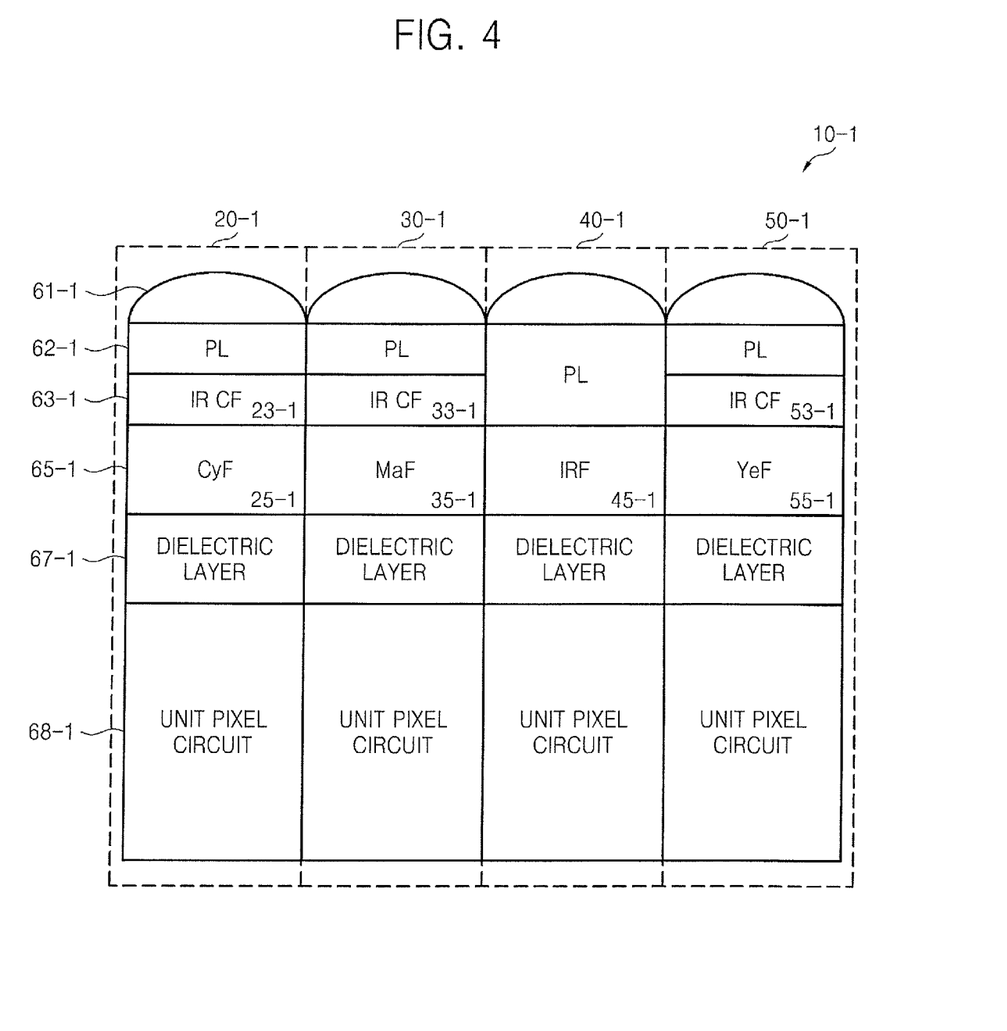
FIG. 4 is a cross-sectional view of a pixel array according to an exemplary embodiment of the present inventive concept.

FIG. 4 is a cross-sectional view of a pixel array 10-1 according to an exemplary embodiment of the present inventive concept. Referring to FIG. 4, the pixel array 10-1 includes a first pixel type and a second pixel type.

In the pixel array 10-1, a first pixel 20-1, a second pixel 30-1, and a third pixel 50-1 are pixels of the first pixel type, and a fourth pixel 40-1 is of the second pixel type. The pixel array 10-1 further includes a unit pixel circuit area 68-1 disposed at each pixel, a dielectric layer 67-1 formed on each pixel, a color filter 65-1 formed on the first through third pixels 20-1, 30-1, and 50-1, an infrared filter 45-1 formed on the fourth pixel 40-1, an infrared cut-off filter 63-1 formed on the first through third pixels 20-1, 30-1, and 50-1, a planarization layer 62-1 formed on each pixel, and a microlens 61-1 disposed on each pixel. The color filter 65-1 includes a cyan filter 25-1 formed on the first pixel 20-1, a magenta filter 35-1 formed on the second pixel 30-1, and a yellow filter 55-1 formed on the third pixel 50-1. The infrared cut-off filter 63-1 includes an infrared cut-off filter 23-1 formed on the first pixel 20-1, an infrared cut-off filter 33-1 formed on the second pixel 30-1, and an infrared cut-off filter 53-1 formed on the third pixel 50-1. Pixels of the first pixel type, including the first pixel 20-1, the second pixel 30-1, and the 3rd pixel 50-1 have a substantially similar structure. Thus, the first pixel type is described herein with reference to the first pixel 20-1.

The first pixel 20-1 includes a microlens 61-1, an infrared cut-off filter 23-1, a color filter 65-1, a dielectric layer 67-1, and a unit pixel circuit area 68-1. The function and operation of the microlens 61-1, the infrared cut-off filter 23-1, the dielectric layer 67-1, and the unit pixel circuit area 68-1 are the same as the function of the microlens 61, the infrared cut-off filter 23, the dielectric layer 67, and the unit pixel circuit area 68 illustrated in FIG. 1, respectively. Thus, descriptions thereof are omitted. In an exemplary embodiment, the pixel array 10-1 may also include a planarization layer 62-1. The function and operation of the planarization layer 62-1 are the same as the function and operation of the planarization layer 62 illustrated in FIG. 1. Thus, a description thereof is omitted.

In an exemplary embodiment, the first pixel 20-1 does not include the microlens 61-1. The microlens 61-1 collects incident light.

The color filter 65-1 passes certain visible wavelengths. For example, the color filter 65-1 of the first pixel 20-1 is a cyan filter 25-1. The cyan filter 25-1 passes wavelengths ranging from about 450 nm to about 550 nm among the visible wavelengths passed by the infrared cut-off filter 23-1 of the first pixel 20-1. The color filter 65-1 of the second pixel 30-1 is a magenta filter 35-1. The magenta filter 35-1 passes wavelengths ranging from about 400 nm to about 480 nm among the visible wavelengths passed by the infrared cut-off filter 33-1 of the second pixel 30-1. The color filter 65-1 of the third pixel 50-1 is a yellow filter 55-1. The yellow filter 55-1 passes wavelengths ranging from about 500 nm to about 600 nm among the visible wavelengths passed by the infrared cut-off filter 53-1 of the third pixel 50-1. The fourth pixel 40-1 of the second pixel type includes an infrared filter 45-1. The infrared filter 45-1 passes only infrared wavelengths among the wavelengths of light passing through the microlens 61-1.

Figure 5:
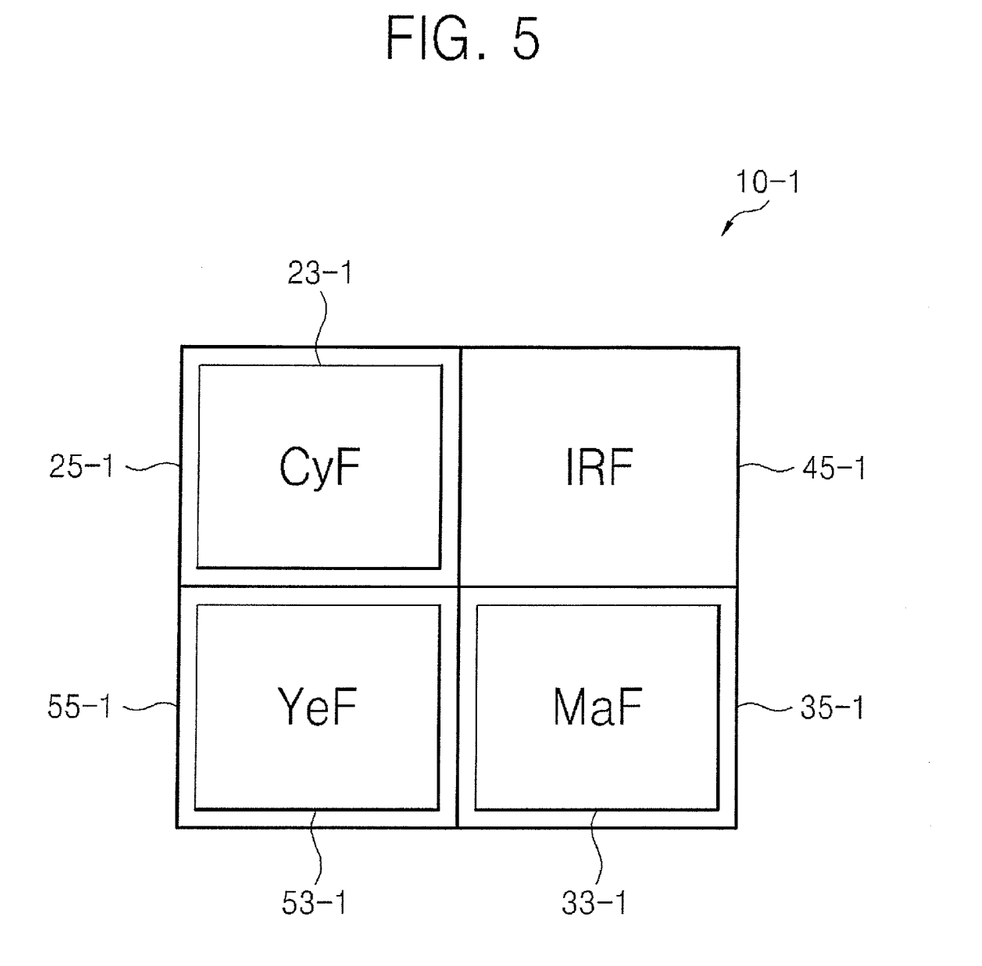
FIG. 5 is a plan view of the pixel array illustrated in FIG. 4 according to an exemplary embodiment of the present inventive concept.

FIG. 5 is a plan view of the pixel array 10-1 illustrated in FIG. 4. Referring to FIGS. 4 and 5, the pixel array 10-1 includes pixels of a first pixel type and a second pixel type. The first pixel 20-1, the second pixel 30-1, and the third pixel 50-1 are of the first pixel type, and the fourth pixel 40-1 is of the second pixel type.

The first pixel 20-1 includes the infrared cut-off filter 23-1 and the cyan filter 25-1. The second pixel 30-1 includes the infrared cut-off filter 33-1 and the magenta filter 35-1. The third pixel 50-1 includes the infrared cut-off filter 53-1 and the yellow filter 55-1.

Pixels of the first pixel type include infrared cut-off filters and color filters. For example, the first through third pixels 20-1, 30-1, and 50-1 include the infrared cut-off filters 23-1, 33-1, and 53-1, and the color filters 25-1, 35-1, and 55-1, respectively. The infrared cut-off filters 23-1, 33-1, and 53-1 may prevent or reduce color crosstalk that may be caused by the color filters 25-1, 35-1, and 55-1.

Pixels of the second pixel type include an infrared filter. For example, the fourth pixel 40-1 includes the infrared filter 45-1. The infrared filter 45-1 passes only the infrared wavelengths. As will be appreciated by one having ordinary skill in the art, the layout pattern of pixels of the first pixel type (e.g., the first through third pixels 20-1, 30-1, and 50-1) and pixels of the second pixel type (e.g., the fourth pixel 40-1) is not limited to the exemplary embodiments illustrated in FIGS. 4 and 5.

Figure 6:
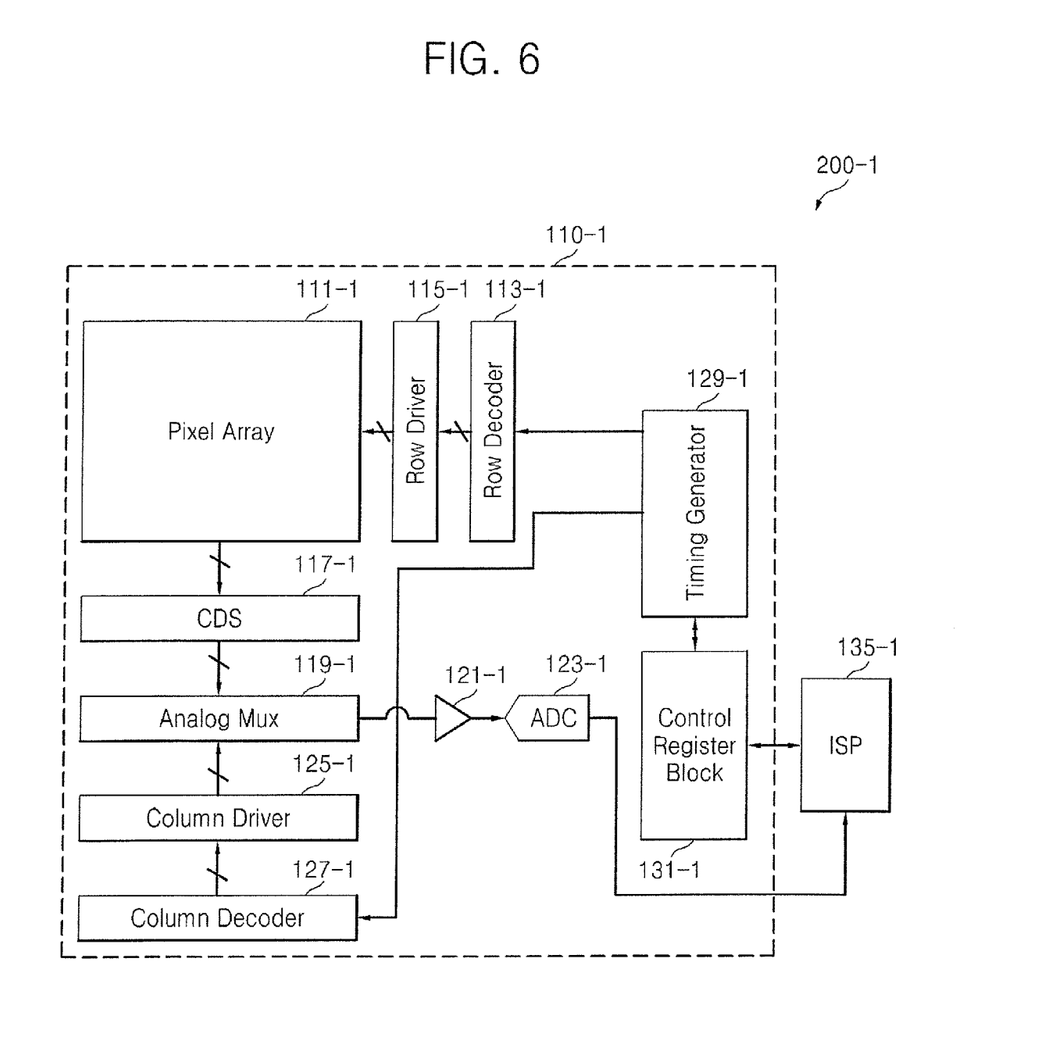
FIG. 6 is a block diagram of an image sensor including the pixel array illustrated in FIG. 1 or 4 according to an exemplary embodiment of the present inventive concept.

FIG. 6 is a block diagram of an image sensor 200-1 including the pixel array 10 or 10-1 illustrated in FIGS. 1 and 4 according to exemplary embodiments of the present inventive concept. The image sensor 200-1 includes a photoelectric conversion circuit 110-1 and an image signal processor (ISP) 135-1. The photoelectric conversion circuit 110-1 and the ISP 135-1 may be implemented on separate chips, respectively, or on a single chip.

The photoelectric conversion circuit 110-1 generates an image signal of an object based on incident light. The photoelectric conversion circuit 110-1 includes a pixel array 111-1, a row decoder 113-1, a row driver 115-1, a correlated double sampling (CDS) block 117-1, an analog selector 119-1, an amplifier 121-1, an analog-to-digital converter (ADC) 123-1, a column driver 125-1, a column decoder 127-1, a timing generator 129-1, and a control register block 131-1.

The pixel array 111-1 may include a plurality of pixels connected with a plurality of row lines and a plurality of column lines in a matrix form. The pixel array 111-1 may be the pixel array 10 illustrated in FIGS. 1 and 3 or the pixel array 10-1 illustrated in FIGS. 4-5. For example, the plurality of pixels in the pixel array 111-1 may include pixels of the first pixel type and the second pixel type as described with reference to FIGS. 1 and 3, or pixels of the first pixel type and the second pixel type as described with reference to FIGS. 4-5. Pixels of the first pixel type respectively include infrared cut-off filters, which may prevent or reduce color crosstalk that may be caused by the color filters of the pixels.

The row decoder 113-1 decodes a row control signal (e.g., an address signal) generated by the timing generator 129-1. The row driver 115-1 selects at least one row line among the plurality of row lines in the pixel array 111-1 in response to a decoded row control signal.

The CDS block 117-1 performs CDS on a pixel signal output from a unit pixel connected to one of the plurality of column lines in the pixel array 111-1, and outputs sampling signals. The analog selector 119-1 selectively outputs one of the sampling signals output from the CDS block 117-1 in response to a column control signal (e.g., an address signal) output from the column driver 125-1.

The column driver 125-1 selectively activates one of the column lines in the pixel array 111-1 in response to a decoded control signal (e.g., a decoded address signal) output from the column decoder 127-1. The column decoder 127-1 decodes a control signal (e.g., an address signal) generated by the timing generator 129-1.

The amplifier 121-1 amplifies a signal output from the analog selector 119-1. The ADC 123-1 converts a signal output from the amplifier 121-1 into a digital signal and outputs the digital signal to the ISP 135-1.

The timing generator 129-1 generates a control signal for controlling the operation of at least one of the pixel array 111-1, the row decoder 113-1, and the column decoder 127-1, based on a command output from the control register block 131-1. The control register block 131-1 generates a variety of commands for controlling the elements of the photoelectric conversion circuit 110-1. The ISP 135-1 generates an image of an object based on pixel signals output from the photoelectric conversion circuit 110-1.

Figure 7:
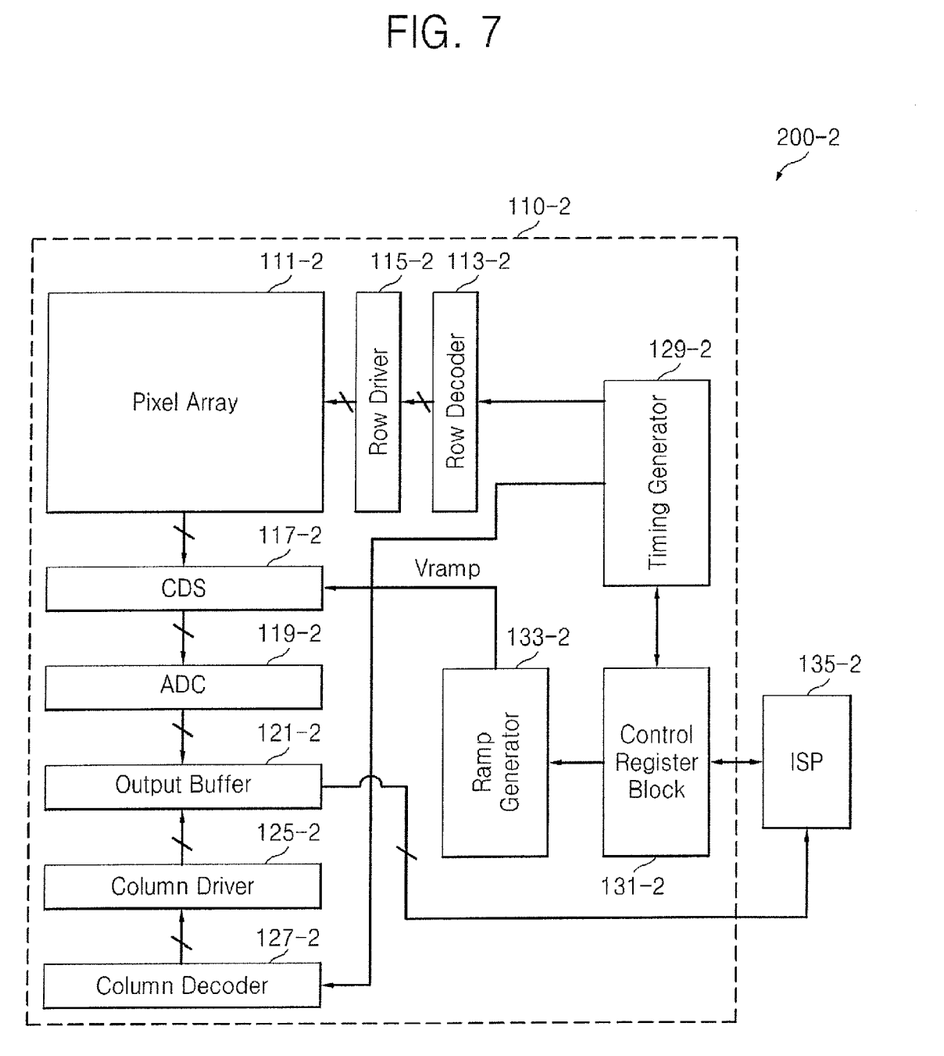
FIG. 7 is a block diagram of an image sensor including the pixel array illustrated in FIG. 1 or 4 according to an exemplary embodiment of the present inventive concept.

FIG. 7 is a block diagram of an image sensor 200-2 including the pixel array 10 or 10-1 illustrated in FIGS. 1 and 4 according to an exemplary embodiment of the present inventive concept. The image sensor 200-2 includes a photoelectric conversion circuit 110-2 and an ISP 135-2. The photoelectric conversion circuit 110-2 and the ISP 135-2 may be implemented on separate chips, respectively, or on a single chip.

The photoelectric conversion circuit 110-2 generates an image signal of an object based on incident light. The photoelectric conversion circuit 110-2 includes a pixel array 111-2, a row decoder 113-2, a row driver 115-2, a CDS block 117-2, an ADC 119-2, an output buffer 121-2, a column driver 125-2, a column decoder 127-2, a timing generator 129-2, a control register block 131-2, and a ramp generator 133-2.

The function and operation of the pixel array 111-2, the row decoder 113-2, the row driver 115-2, the CDS block 117-2, and the column decoder 127-2 are the same as the function and operation of the pixel array 111-1, the row decoder 113-1, the row driver 115-1, the CDS block 117-1, and the column decoder 127-1 illustrated in FIG. 6. Thus, descriptions thereof are omitted.

The ADC 119-2 compares a signal output from the CDS block 117-2 with a ramp signal Vramp received from the ramp generator 133-2, and outputs a digital signal corresponding to a result of the comparison. The output buffer 121-2 buffers and outputs the digital signal output from the ADC 119-2 in response to a column control signal (e.g., an address signal) output from the column driver 125-2.

The timing generator 129-2 generates a control signal for controlling the operation of at least one of the pixel array 111-2, the row decoder 113-2, the output buffer 121-2, the column decoder 127-2, and the ramp generator 133-2 based on a command output from the control register block 131-2. The ramp generator 133-2 outputs the ramp signal Vramp to the CDS block 117-2 in response to the command output from the control register block 131-2. The ISP 135-2 generates an image of an object based on pixel signals output from the photoelectric conversion circuit 110-2.

Figure 8:
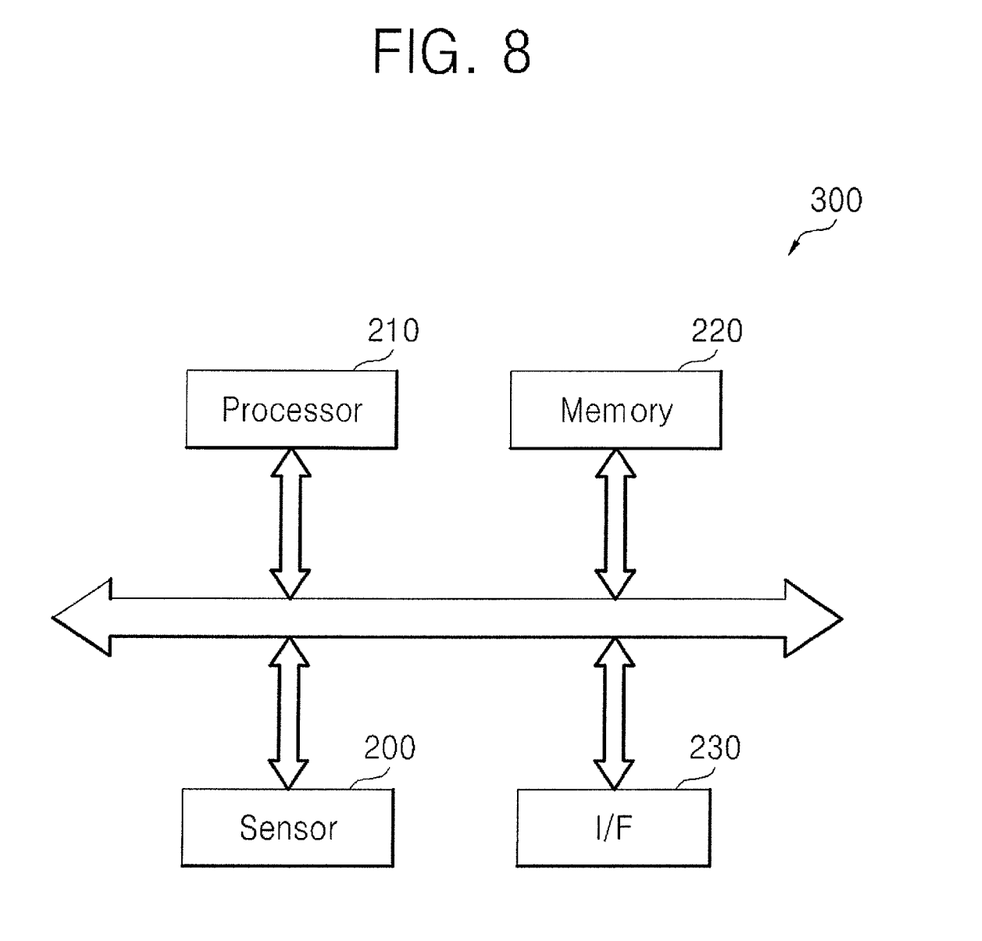
FIG. 8 is a block diagram of an image processing device including the image sensor illustrated in FIG. 6 or 7 according to an exemplary embodiment of the present inventive concept.

FIG. 8 is a block diagram of an image processing device 300 including an image sensor 200. The image sensor 200 is the image sensor 200-1 or 200-2 illustrated in FIGS. 6 and 7 according to exemplary embodiments of the present inventive concept. The image processing device 300 may be, for example, a digital camera, a cellular phone equipped with a digital camera, or any other electronic device equipped with a digital camera.

The image processing device 300 may process, for example, two-dimensional or three-dimensional image information. The image processing device 300 includes the image sensor 200 and a processor 210 controlling the operation of the image sensor 200.

The image processing device 300 may also include an interface (I/F) 230. The I/F 230 may be, for example, an image display device. The image processing device 300 may also include a memory device 220 storing images and/or video captured by the image sensor 200. The memory device 220 may be, for example, a non-volatile memory device which may include a plurality of non-volatile memory cells. The non-volatile memory cells may be, for example, electrically erasable programmable read-only memory (EEPROM) cells, flash memory cells, magnetic random access memory (MRAM) cells, spin-transfer torque MRAM cells, conductive bridging RAM (CBRAM) cells, ferroelectric RAM (FeRAM) cells, phase change RAM (PRAM) cells referred to as Ovonic unified memory cells, resistive RAM (RRAM or ReRAM) cells, nanotube RRAM cells, polymer RAM (PoRAM) cells, nanotube floating gate memory (NFGM) cells, holographic memory cells, molecular electronics memory device cells, or insulator resistance change memory cells.

Figure 9:
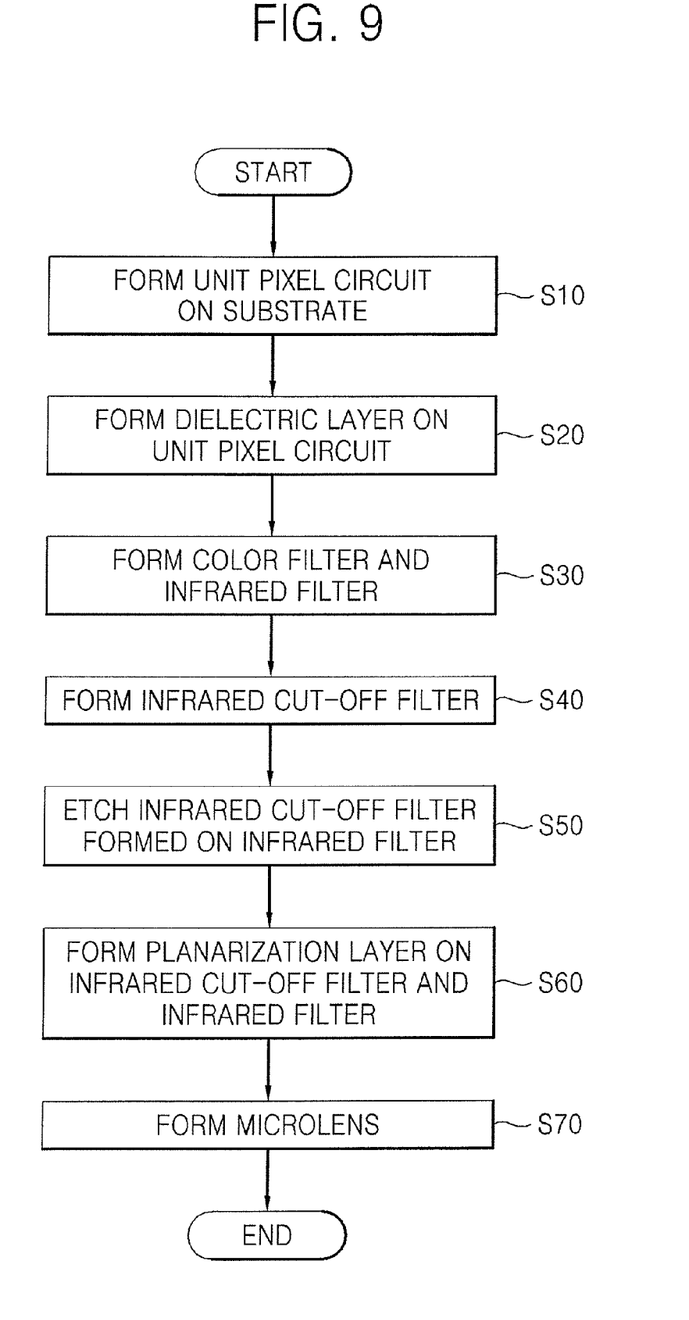
FIG. 9 is a flowchart of a method of manufacturing a pixel for an image sensor including the pixel array illustrated in FIG. 1 according to an exemplary embodiment of the present inventive concept.

FIG. 9 is a flowchart of a method of manufacturing a pixel for an image sensor including the pixel array 10 illustrated in FIG. 1 according to an exemplary embodiment of the present inventive concept. The method may also be used to manufacture a pixel for an image sensor including the pixel array 10-1 illustrated in FIG. 4. Referring to FIGS. 1 and 9, a unit pixel circuit for each of the first pixel types (e.g., the first through third pixels 20, 30, and 50) and the second pixel type (e.g., the fourth pixel 40) are formed on a substrate in operation S10. The unit pixel circuit is implemented in the unit pixel circuit area 68.

The dielectric layer 67 is formed on the unit pixel circuit area 68 in operation S20. The color filter 65 and the infrared filter 45 are formed on the dielectric layer 67 in operation S30. For example, the red filter 25 is formed on the dielectric layer 67 of the first pixel 20, the green filter 35 is formed on the dielectric layer 67 of the second pixel 30, the blue filter 55 is formed on the dielectric layer 67 of the third pixel 50, and the infrared filter 45 is formed on the dielectric layer 67 of the fourth pixel 40. The arrangement of the color filter 65 and the infrared filter 45 disposed on the dielectric layer 67 is not limited to the exemplary embodiment illustrated in FIG. 1.

The infrared cut-off filter 63 is formed on the color filter 65 and the infrared filter 45 in operation S40. The infrared cut-off filter 63 formed on the infrared filter 45 is etched in operation S50. As a result, the infrared cut-off filter 63 is disposed on the first through third pixels 20, 30 and 50. The infrared cut-off filter 63 on the first pixel 20 is the red filter 25, the infrared cut-off filter 63 on the second pixel 30 is the green filter 35, and the infrared cut-off filter 63 on the third pixel 50 is the blue filter 55. The planarization layer 62 may be formed on the infrared cut-off filter 63 and the infrared filter 45 in operation S60. If the planarization layer 62 is formed, the microlens 61 is formed on the planarization layer in operation S70. If the planarization layer 62 is not formed, the microlens 61 is formed on the infrared cut-off filter 63 and the infrared filter 45 in operation S70.

According to exemplary embodiments of the present inventive concept, an infrared cut-off filter which cuts off the infrared wavelengths is disposed on a color filter in a pixel of an image processing device. As a result, color crosstalk that may be caused by the color filter may be prevented or reduced.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An image sensor, comprising:
a planarization layer;
a plurality of filters configured to pass corresponding wavelengths among visible wavelengths;
an infrared cut-off filter disposed between the planarization layer and the plurality of filters, and configured to cut off infrared wavelengths; and
a microlens disposed on the planarization layer,
wherein at least two different type filters from among the plurality of filters are disposed in the same plane,
wherein the plurality of filters includes a red filter, a blue filter, a green filter, and an infrared filter,
wherein the infrared cut-off filter is not disposed on the infrared filter.

2. The image sensor of claim 1,
wherein a thickness of the planarization layer disposed on the infrared filter is greater than a thickness of the planarization layer disposed on each of the red filter, the blue filter, and the green filter.

3. The image sensor of claim 1, wherein a thickness of each of the red filter, the blue filter, and the green filter is about the same as a thickness of the infrared filter.

4. An image sensor, comprising:
a planarization layer;
a plurality of filters configured to pass corresponding wavelengths among visible wavelengths;
an infrared cut-off filter disposed between the planarization layer and the plurality of filters, and configured to cut off infrared wavelengths; and
a microlens disposed on the planarization layer,
wherein at least two different type filters from among the plurality of filters are disposed in the same plane,
wherein the plurality of filters includes a cyan filter, a yellow filter, a magenta filter, and an infrared filter,
wherein the infrared cut-off filter is not disposed on the infrared filter.

5. The image sensor of claim 4, wherein a thickness of the planarization layer disposed on the infrared filter is greater than a thickness of the planarization layer disposed on each of the cyan filter, the yellow filter, and the magenta filter.

6. The image sensor of claim 4, wherein a thickness of each of the cyan filter, the yellow filter, and the magenta filter is about the same as a thickness of the infrared filter.

7. An image sensor, comprising:
a planarization layer;
a plurality of filters configured to pass corresponding wavelengths among visible wavelengths;
a plurality of infrared cut-off filters disposed between the planarization layer and the plurality of filters, and configured to cut off infrared wavelengths, respectively;
a plurality of pixels, wherein each of the plurality of pixels includes a corresponding filter of the plurality of filters and a corresponding infrared cut-off filter of the plurality of infrared cut-off filters;
a correlated double sampling (CDS) block configured to perform a CDS on pixel signals output from the plurality of pixels;
an analog-to-digital converter (ADC) block configured to compare a ramp signal received from a ramp signal generator with each of output signals output from the CDS block and output digital signals corresponding to results of the comparison; and
a microlens disposed on the planarization layer,
wherein the plurality of filters is disposed in the same plane,
wherein the plurality of filters includes a red filter, a blue filter, a green filter, and an infrared filter,
wherein the infrared cut-off filter is not disposed on the infrared filter.

8. The image sensor of claim 7, wherein a thickness of the planarization layer disposed on the infrared filter is greater than a thickness of the planarization layer disposed on each of the red filter, the blue filter, and the green filter.

9. An image processing device, comprising:
an image sensor; and
a processor controlling an operation of the image sensor,
wherein the image sensor comprises:
a planarization layer;
a plurality of filters configured to pass corresponding wavelengths among visible wavelengths;
a plurality of infrared cut-off filters disposed between the planarization layer and the plurality of filters, and configured to cut off infrared wavelengths, respectively;
a microlens disposed on the planarization layer;
a plurality of pixels, wherein each of the plurality of pixels includes a corresponding filter of the plurality of filters and a corresponding infrared cut-off filter of the plurality of infrared cut-off filters;
a correlated double sampling (CDS) block configured to perform a CDS on pixel signals output from the plurality of pixels; and
an analog-to-digital converter (ADC) block configured to compare a ramp signal received from a ramp signal generator with each of output signals output from the CDS block and output digital signals corresponding to results of the comparison,
wherein the plurality of filters is disposed in the same plane,
wherein the plurality of filters includes a red filter, a blue filter, a green filter, and an infrared filter,
wherein the infrared cut-off filter is not disposed on the infrared filter.

10. The image processing device of claim 9,
wherein a thickness of the planarization layer disposed on the infrared filter is greater than a thickness of the planarization layer disposed on each of the red filter, the blue filter, and the green filter.

11. The image processing device of claim 9, wherein a thickness of each of the red filter, the blue filter, and the green filter is about the same as a thickness of the infrared filter.

12. An image processing device, comprising:
an image sensor; and
a processor controlling an operation of the image sensor,
wherein the image sensor comprises:
a planarization layer;
a plurality of filters configured to pass corresponding wavelengths among visible wavelengths;
a plurality of infrared cut-off filters disposed between the planarization layer and the plurality of filters, and configured to cut off infrared wavelengths, respectively;
a microlens disposed on the planarization layer;
a plurality of pixels, wherein each of the plurality of pixels includes a corresponding filter of the plurality of filters and a corresponding infrared cut-off filter of the plurality of infrared cut-off filters;
a correlated double sampling (CDS) block configured to perform a CDS on pixel signals output from the plurality of pixels; and an analog-to-digital converter (ADC) block configured to compare a ramp signal received from a ramp signal generator with each of output signals output from the CDS block and output digital signals corresponding to results of the comparison, wherein the plurality of filters is disposed in the same plane, wherein the plurality of filters includes a cyan filter, a yellow filter, a magenta filter, and an infrared filter, wherein the infrared cut-off filter is not disposed on the infrared filter.

13. The image processing device of claim 12, wherein a thickness of the planarization layer disposed on the infrared filter is greater than a thickness of the planarization layer disposed on each of the cyan filter, the yellow filter, and the magenta filter.

14. The image processing device of claim 12, wherein a thickness of each of the cyan filter, the yellow filter, and the magenta filter is about the same as a thickness of the infrared filter.

* * * * *